United States Patent
Yoon et al.

(10) Patent No.: US 8,642,375 B2
(45) Date of Patent: Feb. 4, 2014

(54) PREPARATION METHOD OF ORGANIC PHOTOVOLTAIC CELL'S PHOTOACTIVE LAYER USING AEROSOL JET PRINTING

(75) Inventors: Sung Cheol Yoon, Gyeonggi-do (KR); Hak Sung Lee, Chungcheongnam-do (KR); Chang Jin Lee, Taejeon-si (KR); Jongsun Lim, Taejeon-si (KR); Yong Gu Kang, Taejeon-si (KR)

(73) Assignee: kOREA Research Institute of Chemical Technology, Taejeon-Si (KR)

( * ) Notice: Subject to any disclaimer, the term of this patent is extended or adjusted under 35 U.S.C. 154(b) by 566 days.

(21) Appl. No.: 12/989,298

(22) PCT Filed: May 30, 2008

(86) PCT No.: PCT/KR2008/003075
§ 371 (c)(1),
(2), (4) Date: Oct. 22, 2010

(87) PCT Pub. No.: WO2009/133984
PCT Pub. Date: Nov. 5, 2009

(65) Prior Publication Data
US 2011/0036403 A1    Feb. 17, 2011

(30) Foreign Application Priority Data
Apr. 28, 2008 (KR) .................. 10-2008-0039370

(51) Int. Cl.
H01L 51/44 (2006.01)
H01L 51/48 (2006.01)
H01L 51/46 (2006.01)

(52) U.S. Cl.
USPC .................................. 438/82; 257/E51.012

(58) Field of Classification Search
None
See application file for complete search history.

(56) References Cited

U.S. PATENT DOCUMENTS

| 7,674,671 B2 | 3/2010 | Renn et al. |
| 2007/0267055 A1 | 11/2007 | Gaudiana et al. |

FOREIGN PATENT DOCUMENTS

| JP | 10500901 A | 1/1998 |
| JP | 11087748 A | 3/1999 |
| JP | 200666707 A | 3/2006 |
| JP | 2007144280 A | 6/2007 |
| JP | 2007207114 A | 8/2007 |
| KR | 20060064570 | 6/2006 |
| KR | 20070110049 | 11/2007 |
| WO | 2006036756 A2 | 4/2006 |
| WO | 2008018030 A2 | 2/2008 |

OTHER PUBLICATIONS

Ansgar Mette et al. 'Further Progress in Metal Aerosol Jet Printing for Front Side Metallization of Silicon Solar Cells' 22nd European Photovoltaic Solar Energy Conference, Sep. 3-9, 2007, Milano, 2DO. 3.2.
P. Peumans, 'Organic Optoelectronics for Renewable Energy', Energy Research at Stanford 2005-2006.

(Continued)

*Primary Examiner* — Seahvosh Nikmanesh
(74) *Attorney, Agent, or Firm* — Westman, Champlin & Koehler, P.A.; Z. Peter Sawicki (57) ABSTRACT

Disclosed is a method of manufacturing the photoactive layer of organic photovoltaic cells using aerosol jet printing. The photoactive layer of the organic photovoltaic cell has high crystallinity and is easily formed into a multilayer structure, thus simplifying the process of manufacturing the organic photovoltaic cells. The solar power conversion efficiency of the organic photovoltaic cells including the photoactive layer is increased, thus facilitating the production of environmentally friendly energy.

16 Claims, 10 Drawing Sheets

(56) References Cited

OTHER PUBLICATIONS

Vak et al., Applied Physics Letters, vol. 91, Aug. 20, 2007. American Institute of Physics, Doojin Vak et al., Fabrication of organic bulk heterojunction solar cells by a spray deposition method for low-cost power generation, p. 081102.

Abstract of KR Publication No. 1020060064570 A, Jun. 13, 2006.

Abstract of KR Publication No. 1020070110049 A, Nov. 15, 2007.

PCT International Search Report, Jan. 14, 2009.

PREPARATION METHOD OF ORGANIC PHOTOVOLTAIC CELL'S PHOTOACTIVE LAYER USING AEROSOL JET PRINTING

CROSS-REFERENCE TO RELATED APPLICATION

The present application is a Section 371 National Stage Application of International Application No. PCT/KR2008/003075, filed May 30, 2008 and published as WO 2009/133984 A1 on Nov. 5, 2009, the content of which is hereby incorporated by reference in its entirety.

TECHNICAL FIELD

The present invention relates to a method of manufacturing the photoactive layer of organic photovoltaic cells using an aerosol jet printing process.

BACKGROUND ART

Although conventional inorganic semiconductor materials have good properties and reliability, they are being replaced with organic semiconductor materials because organic semiconductor materials realize a simple preparation process, enable the inexpensive manufacture of a device, and facilitate the development of materials exhibiting superior properties through simple structural changes to organic substances.

An example of technical applications for organic semiconductor materials includes organic photovoltaic cells.

The photovoltaic cell is composed fundamentally of a semiconductor layer and electrodes. When external light is incident on the photovoltaic cell, electrons and holes are generated in the semiconductor layer, and these charges are moved toward the corresponding poles P and N, respectively, thus generating a difference in potential between the poles P and N. At this time, a load is connected to the photovoltaic cell so that current flows, thereby producing electricity.

When the organic semiconductor material is applied to the photovoltaic cell, it is advantageous in that the device may be easily manufactured using a solution process, such as spin coating, instead of conventional sputtering in a high vacuum.

In 1995, Fred Wudl's group reported {6}-1-(3-(methoxycarbonyl)propyl)-{5}-1-phenyl[5.6]C61, which is a methanofullerene derivative known as PCBM [*J. Org. Chem.*, 1995, 60, 532].

PCBM may be utilized for an organic photovoltaic cell by blending it with donor polymers, such as MEH-PPV, MDMO-PPV, and P3HT. Initially, PCBM was used in a manner of blending with a PPV derivative at a ratio of about 1:3, in order to manufacture the device. In accordance with recent reports, PCBM is blended with P3HT to manufacture a device, which is then thermally treated at high temperatures, or the evaporation rate of a solvent is controlled upon the production of a thin organic film, resulting in photovoltaic devices having high power conversion efficiency of 4% or more.

However, it is difficult to ensure reproducibility using such post-treatment. In the case where the device is subjected to high temperatures, the morphology of the organic film is changed, adversely affecting the efficiency or other device properties.

Further, typical examples of a process of forming an active layer in an organic photovoltaic device using an organic semiconductor material include spin coating, screen printing, and inkjet printing, enabling the easy formation of layers having large areas.

A research team, led by professor G. E. Jabbour, the university of Arizona, USA, 2001, reported an organic photovoltaic device, which is manufactured through screen printing using a blend of MDMO-PPV:PCBM and exhibits power conversion efficiency of 4.3% under a monochromatic laser at 488 nm of 27 mW/cm$^2$, but is problematic in that the above efficiency is merely obtained under the monochromatic laser, whereas the use of an actual light source of AM 1.5 G results in very low efficiency [Appl. Phys. Lett., 79, 2996 (2001)].

In 2005, an organic photovoltaic device having power conversion efficiency of 1.8~2.4% was manufactured by Matsushita Co. Ltd., Japan, by screen printing MDMO-PPV:PCBM, [IEEE Photovoltaic Specialists Conference, 31st, 125 (2005)], and also, in 2007, F. C. Krebs' group manufactured a large-area flexible organic photovoltaic cell 655.2 cm$^2$ in area through spin coating of MDMO-PPV and vacuum evaporation of $C_{60}$, but the power conversion efficiency thereof was 0.0002%, which is evaluated to be very low.

In the journal of Adv. Mater., December, 2007, C. J. Brabec reported an organic photovoltaic cell having power conversion efficiency of 2.9% by forming a thin organic semiconductor film through inkjet printing, but this device is disadvantageous because, in the event of formation of a multilayer structure using inkjet printing, interlayer mixing occurs [Adv. Mater. 19, 3973-3978 (2007)].

In addition, an aerosol jet printing process is mainly applied in a manner such that metal ink is atomized using ultrasonic waves or a carrier gas which is rapidly jetted, printed on a curved substrate, and then sintered using a laser, thus forming highly conductive wires (U.S. Pat. Nos. 7,270,844 and 7,294,366).

In accordance with the conventional solution process, such as spin coating or printing for printing solution-phase ink on a substrate, when an organic film is formed and a layer of solution-phase ink is then formed thereon through dropping, the lower organic film is damaged, thus making it impossible to realize multilayered devices, and further, the resultant devices have properties inferior to multilayered devices manufactured through vacuum evaporation. Therefore, in order to solve the above problems, the present inventors have adopted aerosol jet printing so that ink in a mist form having a size of μm or smaller, formed in an aerosol jet, is jetted onto the surface of a substrate or organic film, thereby realizing a photoactive layer having a multilayer structure while the lower organic film is never damaged, and thus have confirmed an increase in the solar power conversion efficiency of the organic photovoltaic cell including a photoactive layer, manufactured through the method of the present invention, thereby completing the present invention.

DISCLOSURE

Technical Problem

Therefore, the present invention provides a method of manufacturing the photoactive layer of an organic photovoltaic cell using aerosol jet printing which increases the crystallinity of the photoactive layer and facilitates the formation of a multilayer structure thereof.

Technical Solution

According to the present invention, a method of manufacturing the photoactive layer of an organic photovoltaic cell using aerosol jet printing is provided.

Advantageous Effects

According to the present invention, the photoactive layer of the organic photovoltaic cell can have high crystallinity and can be easily formed into a multilayer structure, thus simplifying the process of manufacturing the organic photovoltaic cell. Further, the solar power conversion efficiency of the organic photovoltaic cell including the photoactive layer can be increased, thus producing environmentally friendly energy.

1: substrate
2: transparent conductive oxide layer
3: hole-injection layer
4: organic photoactive layer (mixed layer of donor and acceptor)
5: electrode layer
6: organic photoactive layer (donor layer)
7: organic photoactive layer (acceptor layer)
8: hole-electron recombination layer

BEST MODE

Hereinafter, a detailed description will be given of the present invention.

The present invention provides a method of manufacturing the photoactive layer of an organic photovoltaic cell using aerosol jet printing, including preparing a photoactive solution for an organic photovoltaic cell (step 1); atomizing the photoactive solution prepared in step 1 and transferring it to an aerosol jet nozzle (step 2); and jetting the photoactive solution in a mist form, atomized and transferred to the aerosol jet nozzle in step 2, onto a transparent electrode, thus causing spontaneous crystallization, thereby forming a photoactive layer (step 3); and optionally sintering the photoactive layer deposited in step 3 (step 4).

Specifically, the method of the present invention is stepwisely described below.

In the method of manufacturing the photoactive layer of the organic photovoltaic cell according to the present invention, step 1 is a process of preparing the photoactive solution for an organic photovoltaic cell.

The photoactive solution is applied on the electrode to form the photoactive layer of the organic photovoltaic cell, and is obtained by dissolving an electron donor and an electron acceptor in an organic solvent.

The electron donor includes a p-type organic semiconductor material having a band gap of 2.5~1.4 eV, and the p-type organic semiconductor material is selected from among poly[2-methoxy-5-(2'-ethylhexyloxy)-p-phenylene vinylene] (MEH-PPV), poly[2-methoxy-5-(3,7-dimethyloctyloxy)-1,4-phenylenevinylene] (MDMO-PPV), poly(3-hexylthiophene) (P3HT), and mixtures thereof.

The electron acceptor includes fullerene or derivatives thereof, and preferable examples thereof include phenyl-C61-butyric acid methyl ester (PCBM), derivatives thereof, and mixtures thereof.

In the present invention, the organic solvent is selected from among benzene, toluene, xylene, trimethylbenzene, dichloromethane, chloroform, dichloroethane, trichloroethane, tetrachloroethane, dichloroethylene, trichloroethylene, tetrachloroethylene, chlorobenzene, ortho-dichlorobenzene, and mixtures thereof, but the organic solvent of the present invention is not limited to the above listed examples as long as it dissolves the electron donor or acceptor.

The amount of the donor and acceptor in the photoactive solution according to the present invention is preferably set to 0.1~2.5 wt %. If the amount exceeds 2.5 wt %, the formation of the solution is problematic. Conversely, if the amount is less than 0.5 wt %, the power conversion efficiency of the photovoltaic cell is decreased.

The electron donor and the electron acceptor, which are added to the organic solvent, are blended at a ratio of 1:0.3~1:5 by weight. The blend ratio varies depending on the type of electron donor. In the case where the electron donor is a polymer such as P3HT, the blend ratio is preferably set to 1:0.5~1:1. When the blend ratio falls outside of the above range, the ratio of hole mobility and electron mobility is changed, undesirably decreasing the photoelectric conversion efficiency.

Next, in the method of manufacturing the photoactive layer of the organic photovoltaic cell according to the present invention, step 2 is a process of atomizing the photoactive solution prepared in step 1 and transferring it to the aerosol jet nozzle.

Figure 1:
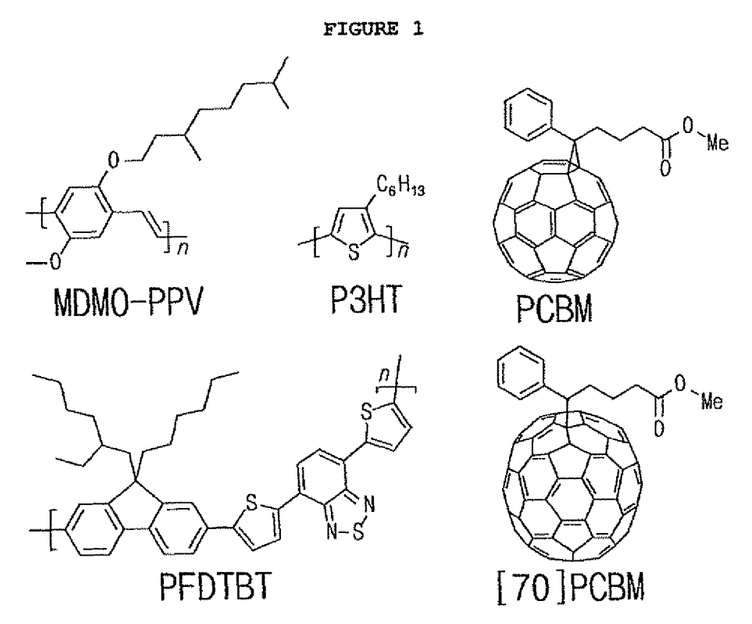
FIG. 1 is a view illustrating the structure of conventional p- and n-type organic semiconductor materials.
Figure 2:
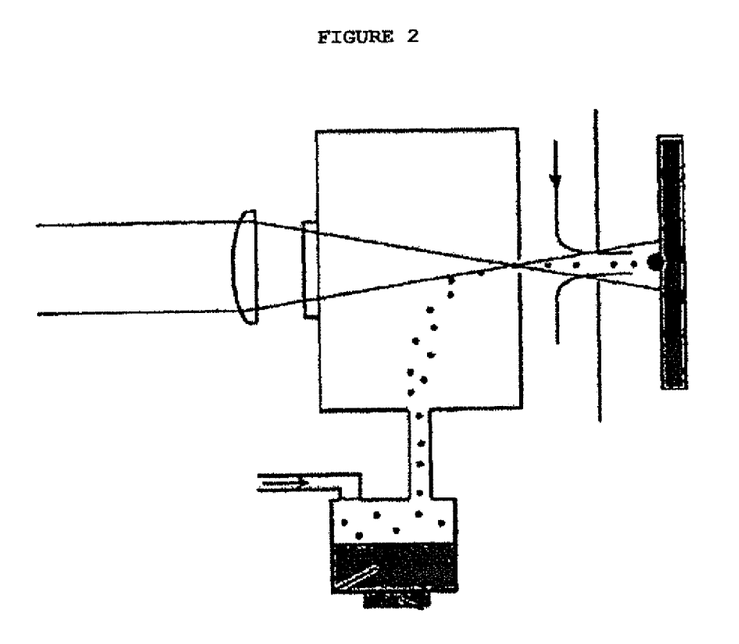
FIG. 2 is a schematic view illustrating an aerosol jet system using ultrasonic waves.
Figure 3:
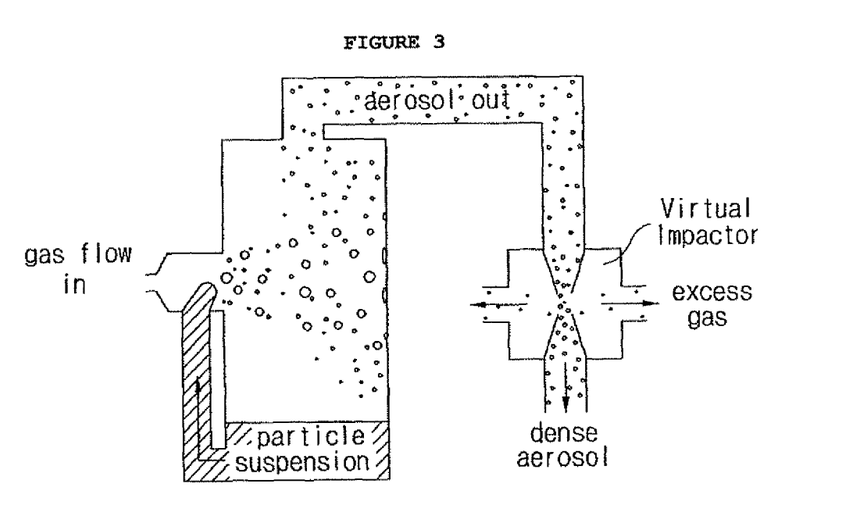
FIG. 3 is a schematic view illustrating an aerosol jet system using a pneumatic process.

In step 2, ultrasonic waves are applied to the photoactive solution to atomize the photoactive solution, thus forming the photoactive solution mist, which is then transferred to the nozzle using a carrier gas (FIGS. 2 and 3).

With reference to FIG. 2, the atomization of step 2 is conducted by applying ultrasonic waves ranging from 20 kHz to 200 MHz to the photoactive solution prepared in step 1, and the atomized photoactive solution mist is then transferred to the aerosol jet nozzle using an inert gas as the carrier gas. Examples of the carrier gas include, but are not limited to, nitrogen, argon, helium, neon, krypton, xenon, and radon.

Alternatively, with reference to FIG. 3, the atomization of step 2 may be conducted by subjecting the photoactive solution prepared in step 1 to a pneumatic process using compressed air of 0~5 psi.

Next, in the method of manufacturing the photoactive layer of the organic photovoltaic cell according to the present invention, step 3 is a process of jetting the photoactive solution mist, atomized and transferred to the aerosol jet nozzle in step 2, onto the transparent electrode to thus cause spontaneous crystallization, thereby forming the photoactive layer.

In step 3, unlike conventional spin coating, when the photoactive layer is formed, external force (e.g., centrifugal force) in a predetermined direction, which obstructs crystallization, is not present, thus permitting spontaneous crystallization of the semiconductor material contained in the photoactive layer. Such spontaneous crystallization of the semiconductor material contained in the photoactive layer increases the crystallinity of the photoactive layer, ultimately increasing the power conversion efficiency of the organic photovoltaic cell. Also, in order to facilitate the jetting process, a sheath gas is additionally used, thus increasing the flow rate of the carrier gas.

Because the jetting rate of the photoactive solution may be increased, the photoactive layer can be uniformly formed even when the distance between the transparent electrode and the nozzle is increased.

In the method of manufacturing the photoactive layer of the organic photovoltaic cell according to the present invention, step 4 for sintering the photoactive layer deposited in step 3 may be optionally conducted.

In step 4, the solvent is evaporated from the photoactive layer formed in the atomized state, and the photoactive layer is sintered, thus increasing the crystallinity of the photoactive layer, resulting in increased photoelectric conversion efficiency.

The sintering process may be conducted using a laser, and the energy of the laser may be controlled so that the solvent is removed from the formed photoactive layer and so that the crystallinity is increased. As well, the laser may be partially radiated, which makes selective fine pattern formation possible.

In addition, the present invention provides a photoactive layer for an organic photovoltaic cell, provided with a multilayer structure through a solution process, which is the above manufacturing method.

In the organic photovoltaic cell manufactured through the method of the present invention, the photoactive layer is formed using an aerosol jet, after which the substrate is heated to remove the solvent, thus requiring no additional thermal treatment. In this way, the photoactive layer of the organic photovoltaic cell can be formed through a simple process.

The photoactive layer of the organic photovoltaic cell manufactured through the above method using aerosol jet printing may be any one selected from among a single organic active layer composed of a blend of an electron donor and an electron acceptor, and photoactive layers having multilayer structures, as illustrated in (a)~(e) below (FIGS. 5 to 10).

(a) donor layer/acceptor layer
(b) donor layer/donor-acceptor blend layer/acceptor layer
(c) donor-acceptor blend layer/electron-hole recombination layer/donor-acceptor blend layer
(d) donor layer/acceptor layer/electron-hole recombination layer/donor layer/acceptor layer
(e) donor layer/donor-acceptor blend layer/acceptor layer/electron-hole recombination layer/donor layer/donor-acceptor blend layer/acceptor layer.

The electron donor of the photoactive layer absorbs light to thus generate electron-hole pairs (excitons) in an excitation state, and the electron-hole pairs diffuse in a random direction and then come into contact with the electron acceptor, thereby separating them into electrons and holes.

In this case, the electrons are moved toward the electron acceptor having high electron affinity, and the holes remain in the electron donor, and thus the electrons are separated from the holes depending on the corresponding charge state. Due to the difference in the concentration of charges in an internal electrical field caused by the difference in work function between the two electrodes, the electrons and holes are moved toward the respective corresponding electrodes, and are then collected, and finally, can flow in the form of current through external circuits, thereby generating electricity.

The photoactive layer according to the present invention essentially includes the electron donor and the electron acceptor, and thus may have a single layer structure composed of a blend of the electron donor and the electron acceptor, or a multilayer structure, as illustrated in (a)~(e), thus having increased light absorption efficiency. As well, the excitons produced in the photoactive layer are effectively separated into the electrons and holes at the interface of the electron donor and acceptor, thereby increasing photoelectric conversion efficiency. In the case of OLEDs, a multilayered film similar thereto is formed, so that electron-hole combination effectively occurs in the emission layer, thus maximizing emission efficiency and device lifespan. Accordingly, in the case of the organic photovoltaic cell, the formation of the photoactive layer having a multilayer structure plays a very important role in increasing the photoelectric conversion efficiency and device lifespan.

Further, the photoactive layer manufactured through the method of the present invention is advantageous because the conditions of aerosol jet printing are controlled, thereby obtaining a mist-deposited thin organic film from which almost all of the solvent is removed. Moreover, various types of multilayer structures may be realized. Hence, even when the donor layer, the acceptor layer, and the electron-hole recombination layer are sequentially formed, interlayer mixing may be minimized, thus effectively obtaining the photoactive layer.

In addition, the organic photovoltaic cell according to the present invention includes a transparent electrode layer, a hole injection layer, a photoactive layer, and an electrode layer, which are sequentially formed on a substrate, and the photoactive layer may be manufactured through the above method using aerosol jet printing, and may be any one selected from among a single organic active layer composed of a blend of an electron donor and an electron acceptor, and photoactive layers having multilayer structures, as illustrated in (a)~(e) below.

(a) donor layer/acceptor layer
(b) donor layer/donor-acceptor blend layer/acceptor layer
(c) donor-acceptor blend layer/electron-hole recombination layer/donor-acceptor blend layer
(d) donor layer/acceptor layer/electron-hole recombination layer/donor layer/acceptor layer
(e) donor layer/donor-acceptor blend layer/acceptor layer/electron-hole recombination layer/donor layer/donor-acceptor blend layer/acceptor layer.

Compared to conventional organic photovoltaic cells, when the photoactive layer of the organic photovoltaic cell according to the present invention is variously formed to have a single layer structure or a multilayer structure, interlayer mixing may be prevented, thereby realizing high light absorption efficiency.

MODE FOR INVENTION

A better understanding of the present invention may be obtained in light of the following examples, which are set forth to illustrate, but are not to be construed to limit the present invention.

EXAMPLE 1

First Manufacture of Organic Photovoltaic Cell Using Aerosol Jet Printing

A washed ITO (Indium Tin Oxide) glass substrate was subjected to $O_2$ plasma treatment, and PEDOT-PSS (poly(3, 4-ethylenedioxythiophene)-poly(styrenesulfonate)) (AI 4083, available from Bayer Baytron) was then spin-coated to a thickness of 40 nm thereon, thus preparing a transparent electrode.

A blend of P3HT (poly-3-(hexylthiophene) and PC71BM at a ratio of 1:0.7 was dissolved in an amount of 0.67 wt % in an ortho-dichlorobenzene solvent, thus preparing a photoactive solution.

The photoactive solution was placed into an aerosol jet system, and voltage of 35V was applied to an ultrasonic transducer, thus atomizing the photoactive solution, after which the atomized photoactive solution was transferred to an aerosol jet nozzle in the presence of nitrogen gas flowing at 18 sccm.

The atomized photoactive solution in the nozzle was accelerated with the addition of a sheath gas (nitrogen gas) at 45 sccm, and was then jetted onto the prepared transparent electrode. The substrate was transferred at a rate of 25 mm/s, and sintering using a laser was conducted, or solvent evaporation at high temperatures was carried out.

On the electrode having the deposited photoactive layer, LiF/Al were deposited in a high vacuum of $10^{-7}$ torr or less, thus forming electrode layers 0.7 nm and 150 nm thick. As such, as the electrode material, typical metal material for an organic cell, such as CaAg alloy, MgAg alloy, or LiAl alloy, may be used, in addition to LiF/Al. Then, a sealing process using a glass cap to which a humectant was attached was conducted, thereby completing the organic photovoltaic cell. The organic photovoltaic cell thus manufactured was thermally treated at 150° C. for 0~60 min, and the change in device properties was observed.

EXAMPLE 2

Second Manufacture of Organic Photovoltaic Cell Using Aerosol Jet Printing

An organic photovoltaic cell was manufactured in the same manner as in Example 1, with the exception that PC61BM (1:0.7) was used instead of PC71BM.

EXAMPLE 3

Third Manufacture of Organic Photovoltaic Cell Using Aerosol Jet Printing

An organic photovoltaic cell was manufactured in the same manner as in Example 2, with the exception that the blend of P3HT and PC61BM was dissolved in an amount of 1 wt %.

EXAMPLE 4

First Manufacture of Organic Photovoltaic Cell Including Photoactive Layer Having Multilayer Structure Using Aerosol Jet Printing An organic photovoltaic cell including a photoactive layer having a multilayer structure was manufactured in the same manner as in Example 2, with the exception that 0.67 wt % of P3HT and 0.67 wt % of PC61BM were sequentially formed on the transparent electrode using aerosol jet printing.

EXAMPLE 5

Second Manufacture of Organic Photovoltaic Cell Including Photoactive Layer Having Multilayer Structure Using Aerosol Jet Printing An organic photovoltaic cell including a photoactive layer having a multilayer structure was manufactured in the same manner as in Example 2, with the exception that 1 wt % of P3HT was dissolved in a chlorobenzene solvent and subjected to aerosol jet printing on the transparent electrode, thus forming a P3HT layer 20 nm thick, 1 wt % of a blend of P3HT:PC71BM (1:0.7) was dissolved in a chlorobenzene solvent and subjected to aerosol jet printing thereon, and then 1 wt % of PC71BM was dissolved in a chlorobenzene solvent and subjected to aerosol jet printing thereon, thus forming a PC71BM layer 20 nm thick.

EXAMPLE 6

First Manufacture of Organic Photovoltaic Cell Through Aerosol Jet Printing Using Pneumatic Process An organic photovoltaic cell was manufactured in the same manner as in Example 1, with the exception that 0.75 wt % of a blend of P3HT (poly-3-(hexylthiophene) and PC71BM at a ratio of 1:0.7 was dissolved in ortho-dichlorobenzene, thus preparing a photoactive solution, which was then placed in an ink vessel for pneumatic printing, atomized using nitrogen gas at 500 sccm through a pneumatic process, transferred to an aerosol jet nozzle, and then jetted using a nitrogen sheath gas at 45 sccm.

COMPARATIVE EXAMPLE 1

Manufacture of Organic Photovoltaic Cell Using Spin Coating

An organic photovoltaic cell was manufactured in the same manner as in Example 1, with the exception that 2.0 wt % of a blend of P3HT and PC71BM at a ratio of 1:0.7 was dissolved in ortho-dichlorobenzene, thus preparing a photoactive solution, which was then applied on the transparent electrode through spin coating, thus forming a photoactive layer 100 nm thick.

EXPERIMENTAL EXAMPLE 1

Power Conversion Efficiency of Organic Photovoltaic Cells

Figure 4:
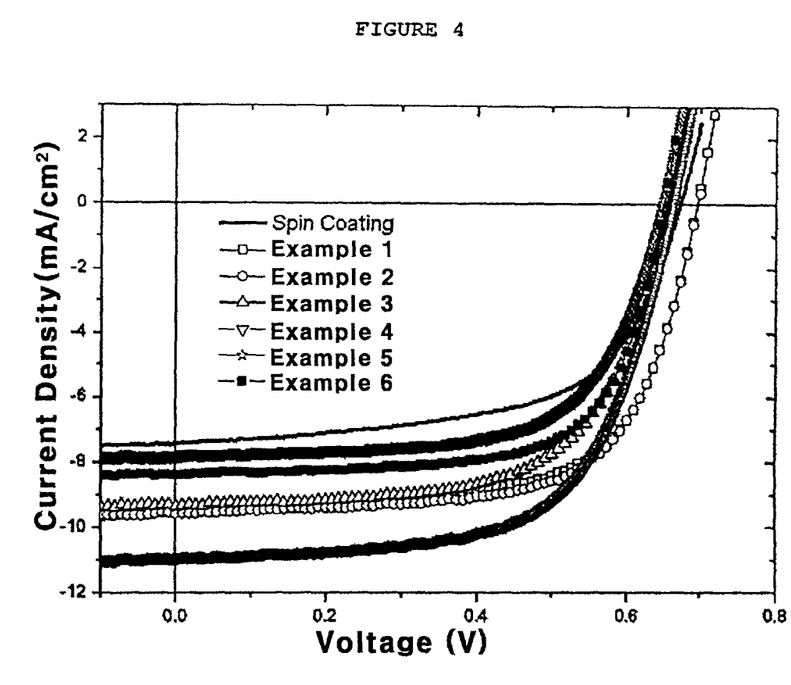
FIG. 4 is an I-V graph of the embodiment of the present invention.
Figure 5:
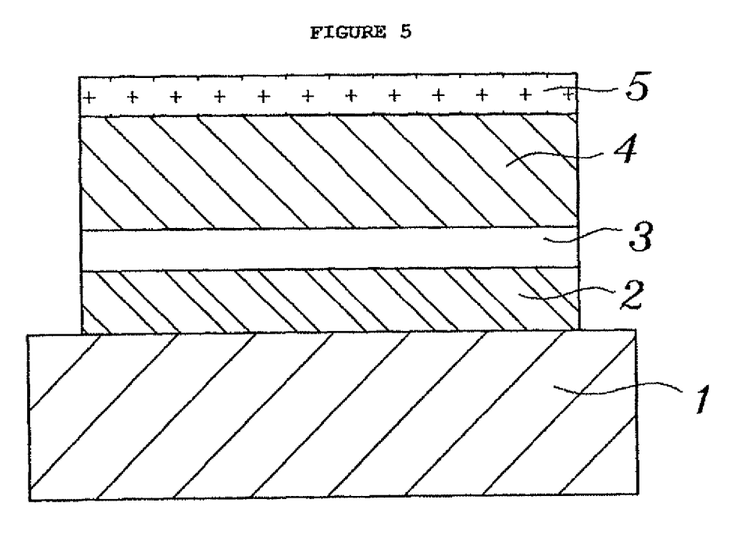
FIGS. 5 to 10 are schematic views illustrating the structure of the organic photovoltaic cell including the photoactive layer using aerosol jet printing.
Figure 6:
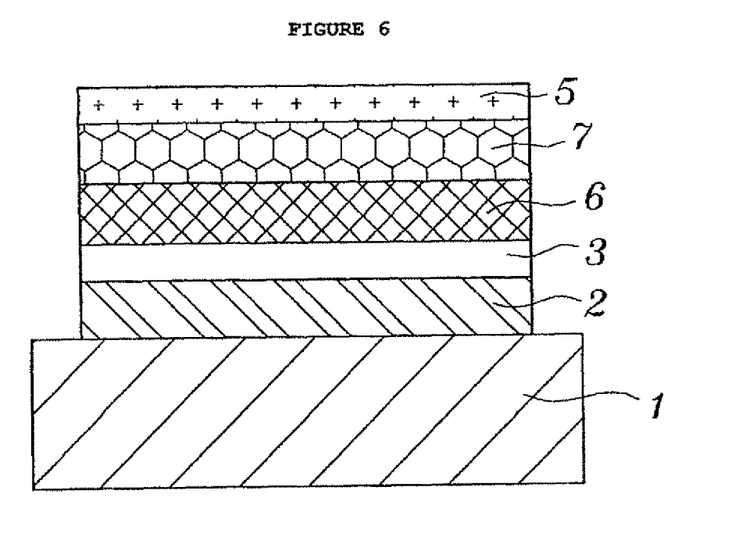
Figure 7:
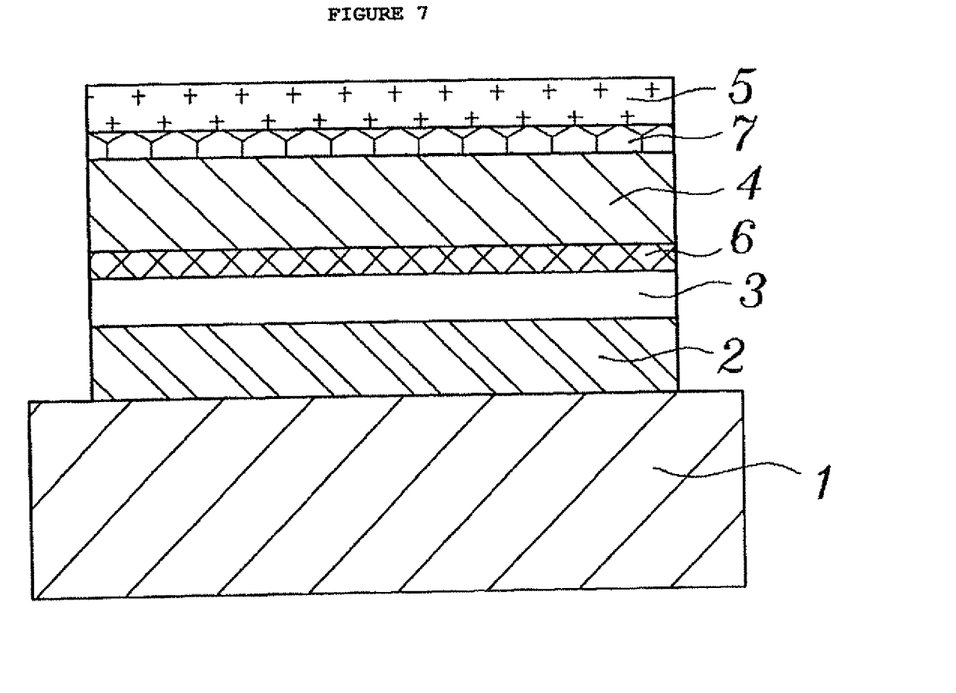
Figure 8:
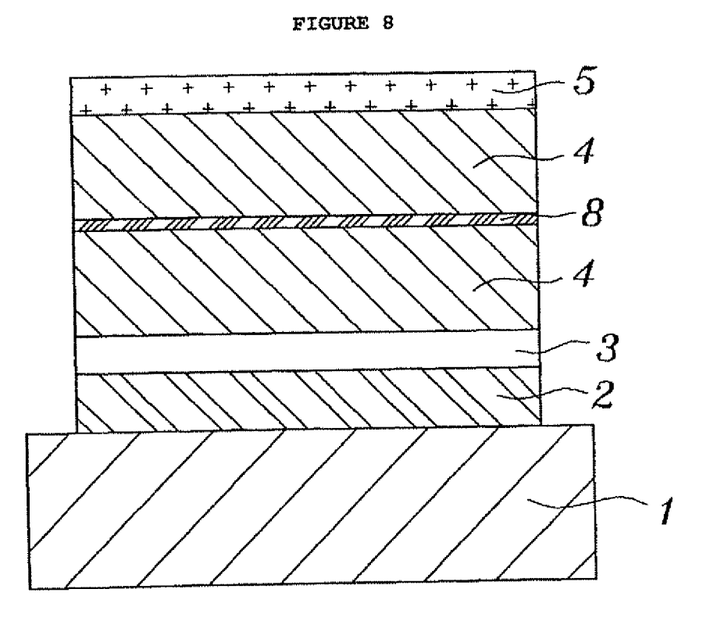
Figure 9:
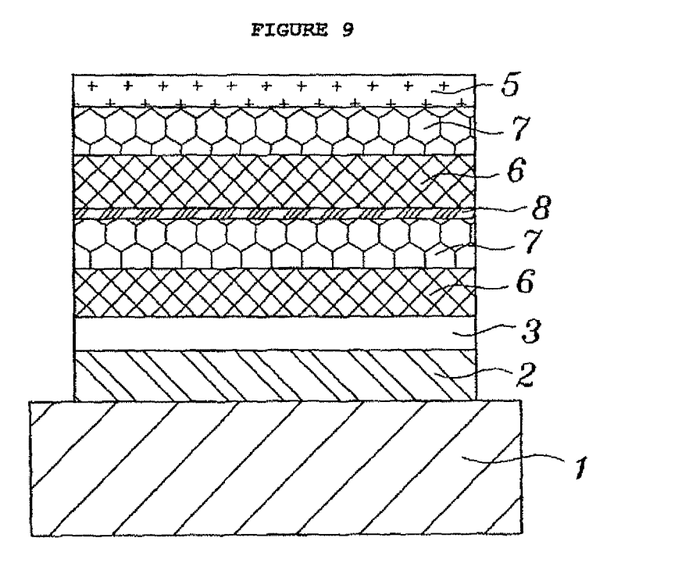
Figure 10:
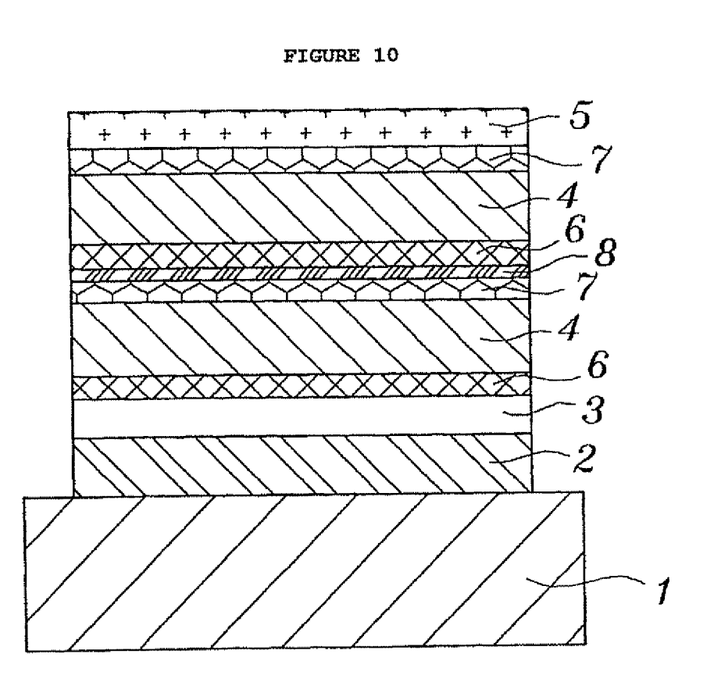

In order to determine the conversion efficiency of the organic photovoltaic cells manufactured as above, open circuit voltage $V_{oc}$, short circuit current density $J_{sc}$, and maximum power of the organic photovoltaic cells of the examples and comparative example were measured. The results are depicted in FIG. 4. These values were substituted into Equation 1 below, thus calculating power conversion efficiency (PCE) of the photovoltaic cell. The results are shown in Table 1 below.

$$PCE\ (\%) = \frac{V_{oc} \times J_{sc} \times FF}{P_{inc}} \qquad \text{Equation 1}$$

wherein $V_{oc}$, is the open circuit voltage (V) (voltage in a state in which current does not flow);

$J_{sc}$ is the short circuit current density (mA/cm$^2$) (current density at 0 V);

FF is the fill factor (value obtained by diving the maximum power by $V_{oc}$ and $J_{sc}$); and $P_{inc}$ is the intensity of radiated light (mW/cm$^2$) (in this experiment, AM1.5 1sun (100 mW/cm$^2$)).

TABLE 1

|  | $V_{oc}$ (mV) | $J_{sc}$ (mA/cm$^2$) | FF (%) | PCE (%) |
| --- | --- | --- | --- | --- |
| Ex. 1 | 695 | 9.43 | 0.66 | 4.35 |
| Ex. 2 | 695 | 9.56 | 0.66 | 4.39 |
| Ex. 3 | 658 | 9.33 | 0.65 | 3.99 |
| Ex. 4 | 650 | 7.78 | 0.65 | 3.29 |
| Ex. 5 | 663 | 10.97 | 0.63 | 4.58 |
| C. Ex. 1 | 673 | 7.43 | 0.60 | 3.00 |

As is apparent from Table 1 and FIG. 4, in Examples 1 to 5, the PCE was determined to be 3.29~4.58%, which was about 10%~50% higher than that of Comparative Example 1. In particular, the PCE of Example 5, in which the photoactive layer having a multilayer structure was formed, was 4.58%, which was observed to be the highest. This was considered to be because the multilayer structure was formed through a simple process, and so the PCE was increased.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method of manufacturing a photoactive layer of an organic photovoltaic cell using aerosol jet printing, comprising:
   preparing a photoactive solution for an organic photovoltaic cell (step 1);
   atomizing the photoactive solution prepared in step 1 and transferring it to an aerosol jet nozzle (step 2); and
   jetting the photoactive solution in a mist form, atomized and transferred to the aerosol jet nozzle in step 2, onto a transparent electrode, thus causing spontaneous crystallization, thereby forming a photoactive layer (step 3).

2. The method according to claim 1, wherein the photoactive solution is obtained by dissolving an electron donor and an electron acceptor in an organic solvent.

3. The method according to claim 2, wherein the electron donor is a p-type organic semiconductor material having a band gap of 2.5~1.4 eV.

4. The method according to claim 3, wherein the p-type organic semiconductor material is selected from a group consisting of poly[2-methoxy-5-(2'-ethylhexyloxy)-p-phenylene vinylene] (MEH-PPV), poly[2-methoxy-5-(3,7-dimethyloctyloxy)-1,4-phenylenevinylene] (MDMO-PPV), poly(3-hexylthiophene) (P3HT), and mixtures thereof.

5. The method according to claim 2, wherein the electron acceptor is an n-type organic semiconductor material, including fullerene and derivatives thereof.

6. The method according to claim 5, wherein the n-type organic semiconductor material is selected from a group consisting of phenyl-C61-butyric acid methyl ester (PCBM), derivatives thereof, and mixtures thereof.

7. The method according to claim 2, wherein the organic solvent is selected from a group consisting of benzene, toluene, trimethylbenzene, xylene, dichloromethane, chloroform, dichloroethane, trichloroethane, tetrachloroethane, dichloroethylene, trichloroethylene, tetrachloroethylene, chlorobenzene, ortho-dichlorobenzene, and mixtures thereof.

8. The method according to claim 2, wherein, in the photoactive solution, the electron donor and the electron acceptor are used in an amount of 0.1~2.5 wt %.

9. The method according to claim 2, wherein a blend ratio by weight of the electron donor and the electron acceptor, which are added to the organic solvent, is set to 1:0.3~1:5.

10. The method according to claim 1, wherein the atomizing in step 2 is conducted by applying ultrasonic waves ranging from 20 kHz to 200 MHz to the photoactive solution prepared in step 1.

11. The method according to claim 1, wherein the atomizing in step 2 is conducted by subjecting the photoactive solution prepared in step 1 to a pneumatic process using compressed air of 0.01~5 psi.

12. The method according to claim 1, wherein the photoactive solution atomized in step 2 is transferred to the aerosol jet nozzle using an inert gas as a carrier gas.

13. The method according to claim 1, wherein the jetting in step 3 is facilitated with additional use of a sheath gas to increase a flow rate of the carrier gas.

14. The method according to claim 1, further comprising sintering the photoactive layer deposited in step 3 (step 4).

15. The method according to claim 1, wherein the photovoltaic layer is a single organic active layer comprising a blend of an electron donor and an electron acceptor, or multilayer structures selected from the group consisting of (a)~(e) below:
   (a) donor layer/acceptor layer
   (b) donor layer/donor-acceptor blend layer/acceptor layer
   (c) donor-acceptor blend layer/electron-hole recombination layer/donor-acceptor blend layer
   (d) donor layer/acceptor layer/electron-hole recombination layer/donor layer/acceptor layer
   (e) donor layer/donor-acceptor blend layer/acceptor layer/electron-hole recombination layer/donor layer/donor-acceptor blend layer/acceptor layer.

16. A method of fabricating organic photovoltaic cell comprising a transparent electrode layer, a hole injection layer, a photoactive layer, and an electrode layer, which are sequentially formed on a substrate, and the method comprises:
   a step of preparing a substrate on which a transparent electrode layer and a hole injection layer are sequentially formed;
   a step of forming a photovoltaic layer on the hole injection layer; and
   a step of forming an electrode layer on the photovoltaic layer,
   wherein the step of forming a photovoltaic layer comprises:
   preparing a photoactive solution for an organic photovoltaic cell (step 1);
   atomizing the photoactive solution prepared in step 1 and transferring it to an aerosol jet nozzle (step 2); and
   jetting the photoactive solution in a mist form, atomized and transferred to the aerosol jet nozzle in step 2, onto a transparent electrode, thus causing spontaneous crystallization, thereby forming a photoactive layer (step 3).

* * * * *